US012740099B2

(12) United States Patent
Barlage et al.

(10) Patent No.: US 12,740,099 B2
(45) Date of Patent: Sep. 15, 2026

(54) THIN FILM TRANSISTOR WITH SOURCE-CHANNEL INTERFACIAL MEMBER

(71) Applicant: Zinite Corporation, Edmonton (CA)

(72) Inventors: Douglas W. Barlage, Edmonton (CA); Gem Shoute, Edmonton (CA); Alex M. Ma, Edmonton (CA)

(73) Assignee: ZINITE CORPORATION, Edmonton (CA)

( * ) Notice: Subject to any disclaimer, the term of this patent is extended or adjusted under 35 U.S.C. 154(b) by 370 days.

(21) Appl. No.: 18/539,612

(22) Filed: Dec. 14, 2023

(65) Prior Publication Data

US 2024/0213370 A1 Jun. 27, 2024

Related U.S. Application Data

(60) Provisional application No. 63/435,118, filed on Dec. 23, 2022.

(51) Int. Cl.
*H10D 30/67* (2025.01)

(52) U.S. Cl.
CPC ..... *H10D 30/6713* (2025.01); *H10D 30/6728* (2025.01); *H10D 30/6755* (2025.01)

(58) Field of Classification Search
CPC ........... H10D 30/6713; H10D 30/6755; H10D 30/6728
See application file for complete search history.

(56) References Cited

U.S. PATENT DOCUMENTS

| | | | |
|---|---|---|---|
| 2012/0025187 | A1 | 2/2012 | Park et al. |
| 2012/0242627 | A1 | 9/2012 | Kim et al. |
| 2014/0131704 | A1 | 5/2014 | Yamazaki et al. |
| 2016/0336460 | A1 | 11/2016 | Wang et al. |
| 2017/0125249 | A1 | 5/2017 | Price et al. |
| 2017/0256650 | A1 | 9/2017 | Godo et al. |
| 2022/0336671 | A1 | 10/2022 | Dai et al. |

FOREIGN PATENT DOCUMENTS

| | | | |
|---|---|---|---|
| EP | 2339638 | A1 | 6/2011 |
| EP | 2339639 | A1 | 6/2011 |
| WO | WO-2023285936 | A1 | 1/2023 |

*Primary Examiner* — Norman D Richards
*Assistant Examiner* — Sean Ayers Winters
(74) *Attorney, Agent, or Firm* — Perry + Currier Inc.

(57) ABSTRACT

A novel thin film transistor (TFT) includes a source channel interfacial member between at least the source of the transistor and the semiconductor member in which the channel will be formed. The TFT further includes at least a source carrier reservoir in contact with the source and the source end of the semiconductor member. The interaction of the source channel interfacial member and the carrier reservoir provides the TFTs with an increased threshold voltage to place the TFT into an ON state and with reduced current leakage when the TFTs are in an OFF state and the source carrier reservoir provides a source of charge carriers to inhibit carrier starvation through the channel. The materials selected for formation of the TFTs also allow the TFTs to be formed with MOL and/or BEOL processes over logic and other circuitry formed in conventional FEOL processes to obtain three dimensional circuits on semiconductor dies.

20 Claims, 7 Drawing Sheets

THIN FILM TRANSISTOR WITH SOURCE-CHANNEL INTERFACIAL MEMBER

CROSS-REFERENCE TO RELATED APPLICATION(S)

This application claims the benefit of U.S. Provisional Patent Application No. 63/435,118, filed Dec. 23, 2022, entitled "THIN FILM TRANSISTOR"; the entire contents of which are incorporated herein by reference.

FIELD OF THE INVENTION

The present invention relates to transistors. More specifically, the present invention relates to novel thin film transistors.

BACKGROUND OF THE INVENTION

Thin film transistors (TFTs) are presently widely employed in semiconductor devices. TFTs get their name from the fact that they are typically fabricated from very thin layers of semiconductor materials, metals and insulators. One of the advantages of TFTs is that they can be substantially transparent to visible light and can be manufactured on display screens, etc.

Due to their construction from thin layers of materials, TFTs can suffer from undesired performance characteristics. For example, TFTs typically do not turn OFF well, resulting in relatively high leakage currents, with corresponding increased power usage and thermal issues. Often, TFTs suffer from very low threshold voltages (the voltage at which the transistor turns ON) and, in many cases, the threshold voltage can even be a negative voltage, requiring more complex circuit designs to put the TFT into an OFF state. As the size of the TFT is decreased, these problems are exacerbated.

To alleviate these challenges, the semiconductor layer which forms the channel when sufficient voltage is applied to the gate of the TFT is often engineered to be as thin as possible, which can improve OFF-state performance. However, thinning the channel layer also limits the total current throughput through the TFT due to subsequent carrier starvation in the adjacent source, thus limiting ON-state performance, especially at small-scale gate lengths, as well as limiting the available use cases for TFTs.

Further, to date TFTs have been manufactured using conventional front end of line (FEOL) techniques. This has limited the manufacture and use of TFTs within broader semiconductor fabrication processes and use cases.

SUMMARY OF THE INVENTION

It is an object of the present invention to provide novel thin film transistors which obviate or mitigate at least one of the disadvantages of the prior art.

According to a first aspect of the present invention, there is provided a thin film transistor, comprising: an insulator; a source formed on the insulator; a drain formed on the insulator; an n-type semiconductor member; a source-channel interfacial member formed on the insulator and extending between at least the n-type semiconductor member and the source, the source-channel interfacial member acting as a voltage controlled electron transport barrier; a gate dielectric formed over the n-type semiconductor member; a gate formed on the gate dielectric; an n-type semiconductor carrier reservoir formed at the source; and wherein a channel is formed in the n-type semiconductor member when a threshold voltage is applied to the gate electrode, the channel conducting charge carriers through the n-type semiconductor member from the source to the drain and wherein the carrier reservoir provides a reservoir of negative charge carriers to mitigate carrier starvation through the channel of the n-type semiconductor member.

Preferably, the n-type semiconductor carrier reservoir has an effective electron mass of available electronic states similar to that of the n-type semiconductor member. Also preferably, the thin film transistor can be fabricated in middle of line and/or back end of line fabrication processes. Also preferably, the thin film transistor can be fabricated in lateral or vertical configurations.

According to another aspect of the present invention, there is provided a thin film transistor, comprising: a source; a drain; a gate; an n-type semiconductor member in which a channel can be formed; a source-channel interfacial member being a p-type material and connecting the source to the semiconductor member and being operable to establish a threshold voltage which, when applied to the gate, enables a conductive channel to form through the n-type semiconductor member from the source to the drain; and a source carrier reservoir contacting the source and the n-type semiconductor member, the source carrier reservoir being an n-type semiconductor providing a supply of charge carriers to the n-type semiconductor member when the threshold voltage is applied.

According to another aspect of the present invention, there is provided a thin film transistor, comprising: an insulator; a source formed on the insulator; a drain formed on the insulator; an n-type semiconductor member; a p-type source-channel interfacial member formed on the insulator and extending between at least the n-type semiconductor member and the source; a gate dielectric formed over the n-type semiconductor member; a gate formed on the gate dielectric; an n-type semiconductor carrier reservoir formed on the source; a source electrode formed on the carrier reservoir; a gate electrode formed on the gate; and a drain electrode formed on the drain; and wherein a channel is formed in the n-type semiconductor member when a threshold voltage is applied to the gate electrode, the channel conducting charge carriers through the n-type semiconductor member and wherein the carrier reservoir provides a reservoir of negative charge carriers to mitigate carrier starvation through the channel of the n-type semiconductor member and wherein the source-channel interfacial member forms a depletion region in the n-type semiconductor member when the threshold voltage is not applied to the gate to substantially inhibit current flow through the n-type semiconductor member.

The present invention provides novel thin film transistors which include a source-channel interfacial member to establish a threshold voltage required to place the transistor into an ON state and to reduce, or substantially eliminate, OFF state leakage currents and wherein the transistor also includes a carrier reservoir to mitigate, or eliminate, carrier starvation when the transistor is in the ON state. The transistors can be fabricated in middle of the line and/or in back end of the line semiconductor fabrication processes.

BRIEF DESCRIPTION OF THE DRAWINGS

Preferred embodiments of the present invention will now be described, by way of example only, with reference to the attached Figures which are not shown to scale, and wherein.

DETAILED DESCRIPTION OF THE INVENTION

The manufacture of members and/or features of semiconductor devices is described herein as "forming" and, as will be apparent to those of skill in the art, "forming" is intended to comprise all semiconductor manufacturing techniques suitable and applicable therefor including, without limitation: deposition (chemical, atomic layer, physical vapor, etc.); sputtering; PECVD (Plasma Enhanced Chemical Vapor Deposition); implantation and annealing, oxidation; etc.

Figure 1:
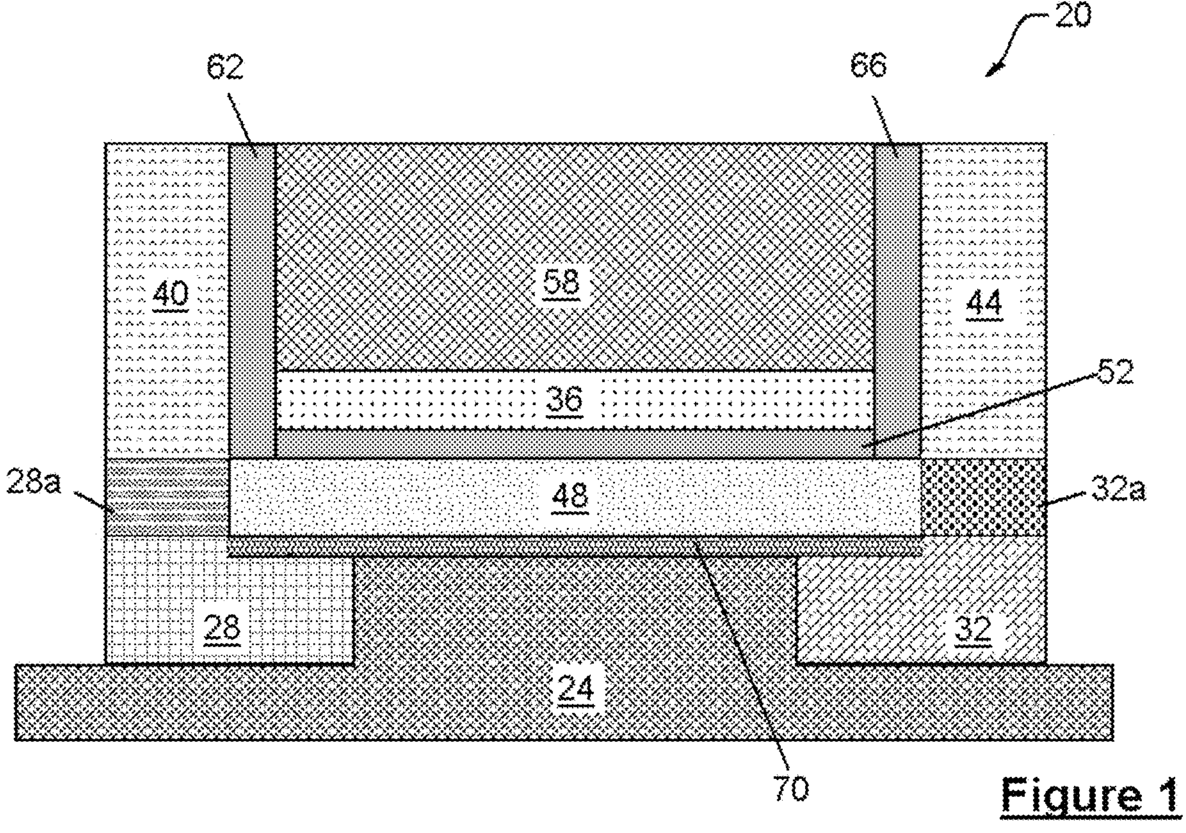
FIG. 1 shows a schematic view of a cross section through a TFT in accordance with an aspect of the present invention.

A TFT in accordance with an aspect of the present invention is indicated generally at 20 in FIG. 1. TFT 20 is formed on a substrate 24, such as an insulating substrate or interlayer dielectric, and can be a layer of a suitable dielectric such as silicon dioxide, glass, plastic, etc.

All TFTs, including TFT 20, have the basic structure of a field effect transistor and include a source 28, a drain 32 and a gate 36. In TFT 20, source 28 and drain 32 can be elemental materials or compound of materials with conducting properties, such as a metal or a degenerate (highly doped) semiconductor. Examples of suitable materials that can be used as source 28 or drain 32 include: nickel, tungsten, molybdenum, copper, cobalt, ruthenium, degenerate n-type silicon, or, any Ill-V compound semiconductor with high conductivity with predominately n-type or electron transport. The specific selection of material for source 28 is made in conjunction with the selected material for gate 36 and the selection of these two materials is a factor in the determination of the threshold voltage of TFT 20. The selection of these materials is well within the capability of those skilled in the field of transistor design and fabrication.

Source 28 is connected to a source electrode 40 through a source carrier reservoir **28*a*. Source carrier reservoir 28*a* is preferably formed of an n-type semiconductor material which is much more heavily n-type than semiconductor member 48 (described below) and which, preferably, has a similar allowed density of states to that of semiconductor member 48, as is also discussed below. Examples of suitable materials for source carrier reservoir 28*a* include heavily n-doped poly-silicon or germanium, tin oxide, indium oxide, tungsten, or other materials, as will occur to those of skill in the art, which have electron effective masses close to the electron effective mass of semiconductor member 48**.

Similarly, in TFT 20 drain 32 is connected to drain electrode 44 through a drain reservoir **32*a*. The materials of which drain reservoir 32*a* and drain 32 are formed are preferably selected to provide effective conduction of carriers out of the channel of semiconductor member 48** and they can be the same material or, more commonly, different materials.

Drain electrode 44 can be any suitable material to form a desired electrical connection between drain reservoir **32*a* and other circuitry that connects to TFT 20**.

As mentioned above, TFT 20 includes an n-type semiconductor member 48 which is formed to extend between source 28 and drain 32, and to contact carrier reservoir **28*a* and drain reservoir 32*a*. Semiconductor member 48 comprises any suitable metal oxide, such as: zinc oxide; tin oxide; indium gallium zinc oxide (IGZO); gallium oxide; germanium oxide; etc. The n-type semiconductor material of which semiconductor member 48** is formed is preferably selected such that it can be formed and annealed at temperatures not exceeding about 400 degrees centigrade to ensure compatibility with middle of line ("MOL") and/or back end of line ("BEOL") manufacturing processes.

A gate dielectric member 52, which can be any suitable dielectric material, such as silicon dioxide, silicon nitride, hafnium oxide, zirconium oxide, aluminum oxide, or combinations thereof, is formed over semiconductor member 48 to block free carrier flow and gate 36 is formed on gate dielectric member 52. Gate 36, which can be any suitable material, such as titanium, titanium nitride, chromium, hafnium, tantalum nitride or any other single element or bimetal element or compound, as will occur to those of skill in the art, is connected to a gate electrode 58 which is selected to provide a good electrical connection between gate 36 and other circuitry that connects to TFT 20.

As is known to those of skill in the art, when an electric field is applied to gate 36, a conductive channel is formed through semiconductor member 48, allowing current to flow through this channel, from source carrier reservoir **28*a* and source 28 to drain reservoir 32*a* and drain 32**.

Source electrode 40 is electrically insulated from gate 36 and gate electrode 58 by a source dielectric spacer 62 and drain electrode 44 is electrically insulated from gate 36 and gate electrode 58 by drain dielectric spacer 66. Source dielectric spacer 62 and drain dielectric spacer 66 can be any suitable dielectric material, such as silicon dioxide, etc. In some cases, source dielectric spacer 62 and drain dielectric spacer 66 will be low-K dielectrics, while gate dielectric member 52 will be a high-K dielectric, but in other cases source dielectric spacer 62, drain dielectric spacer 66 and gate dielectric member 52 can be formed of the same material. It is also contemplated that source dielectric spacer 62 and/or drain dielectric spacer 66 can be a void (e.g. —an absence of material) which can advantageously reduce parasitic capacitances in TFT 20.

In order to enhance the OFF state performance of TFT 20, the present inventors have determined that providing a source-channel interfacial member 70 can increase the threshold voltage at which TFT 20 turns ON, making the transistor operate in enhancement mode, and can reduce the leakage current through TFT 20 in the OFF state.

Specifically, source-channel interfacial member 70 is provided to create a repository of complimentary excess negative charge that functions to deplete the channel in at least the region of semiconductor member 48 adjacent source 28 and carrier reservoir **28*a*. In this manner, source-channel interfacial member 70 serves as a voltage controlled electron transport barrier, resulting in substantially no current flow through semiconductor member 48 when TFT 20** is in an 'OFF' state.

Further, source-channel interfacial member 70 also serves to reduce stress induced leakage currents ("SILC") in TFT 20 by inhibiting the formation of interlayer stress-induced flaws between semiconductor member 48 and source 28.

Source-channel interfacial member 70 can be formed in a variety of configurations, including a p-type semiconductor, an induced piezoelectric dipole, a controllable tunneling barrier, combinations thereof or other mechanisms to modulate injected current by an externally applied field.

For example, when implemented as a p-type semiconductor, source-channel interfacial member 70 can consist of elemental germanium or source-channel interfacial member 70 can be formed by using a p-type dopant in a relevant portion of semiconductor member 48. In other cases, source-channel interfacial member 70 can consist of an oxide or a sulfide, or another element corresponding to group VI(A) of the periodic table, such as ruthenium oxide, silicon nitride, nickel oxide, copper oxide, molybdenum oxide, iridium oxide, or a metal ion paired with a chalcogen, such as oxygen, sulfur, selenium or tellurium compounds.

Source-channel interfacial member 70 can also be formed by a catalytic growth of the material that forms source 28, such as ruthenium and ruthenium oxide, tungsten and tungsten oxide, other metals that form self-limiting oxide layers, or degeneratively doped poly-crystalline silicon in combination with a chemically limited silicon dioxide or a nitride barrier layer. In such cases, the oxygen can preferentially traverse to the source-channel interface, creating source-channel interfacial member 70. In other cases, source-channel interfacial member 70 can be formed by depositing a p-type material, such as a p-type metal oxide or another semiconductor, by way of a deposition technique, such as atomic layer deposition, sputtering physical vapor deposition or chemical vapor deposition.

It has been found, due to the efficacy of source-channel interfacial member 70 in TFT 20, that TFT 20 could experience carrier starvation when in the ON state. To provide a reservoir of negative charge carriers to mitigate such carrier starvation, source carrier reservoir **28*a* can be formed as a charge source adjacent source 28 and semiconductor member 48 and drain reservoir 32*a* can be formed adjacent drain 32 and semiconductor member 48**.

In the example of TFT 20 FIG. 1, and as mentioned above, source carrier reservoir **28*a* is formed between source 28 and source electrode 40, adjacent semiconductor member 48. Source carrier reservoir 28*a* can be formed from the same material as source 28, while in other implementations, source carrier reservoir 28*a* is preferably formed of other suitable materials which are selected such that the electron barrier between the channel formed in semiconductor member 48 and source carrier reservoir 28*a* and source 28 is minimized, or forms a slowly increasing gradient, so that electrons do not experience a significant reflection probability when traversing the boundary between reservoir 28*a*, source 28 and semiconductor member 48**

Source carrier reservoir **28*a* preferably has an effective electron mass, or density, of available electronic states that are at a similar level as the channel material of semiconductor member 48 itself. Source carrier reservoir 28*a* can be a monoatomic semiconductor such as silicon, germanium, or tin that is degenerately doped or can be a binary, ternary quaternary, etc., semiconductor material that is doped to produce a high degree of electrons. Drain reservoir 32*a*** can be selected and formed similarly.

Generally, source carrier reservoir **28*a* and drain reservoir 32*a* (if present) should not be a metal because the large density of states in the metal can give rise to a reflection at the interface to the channel formed in semiconductor member 48 and the pre-channel of semiconductor member 48** due to the disparity between available electron states.

In the example of FIG. 1, drain reservoir **32*a* is formed between drain 32 and drain electrode 44, adjacent semiconductor member 48. Drain reservoir 32*a* serves as an electron receiver to enhance the flow of electrons out of the channel formed in semiconductor member 48**.

Figure 2:
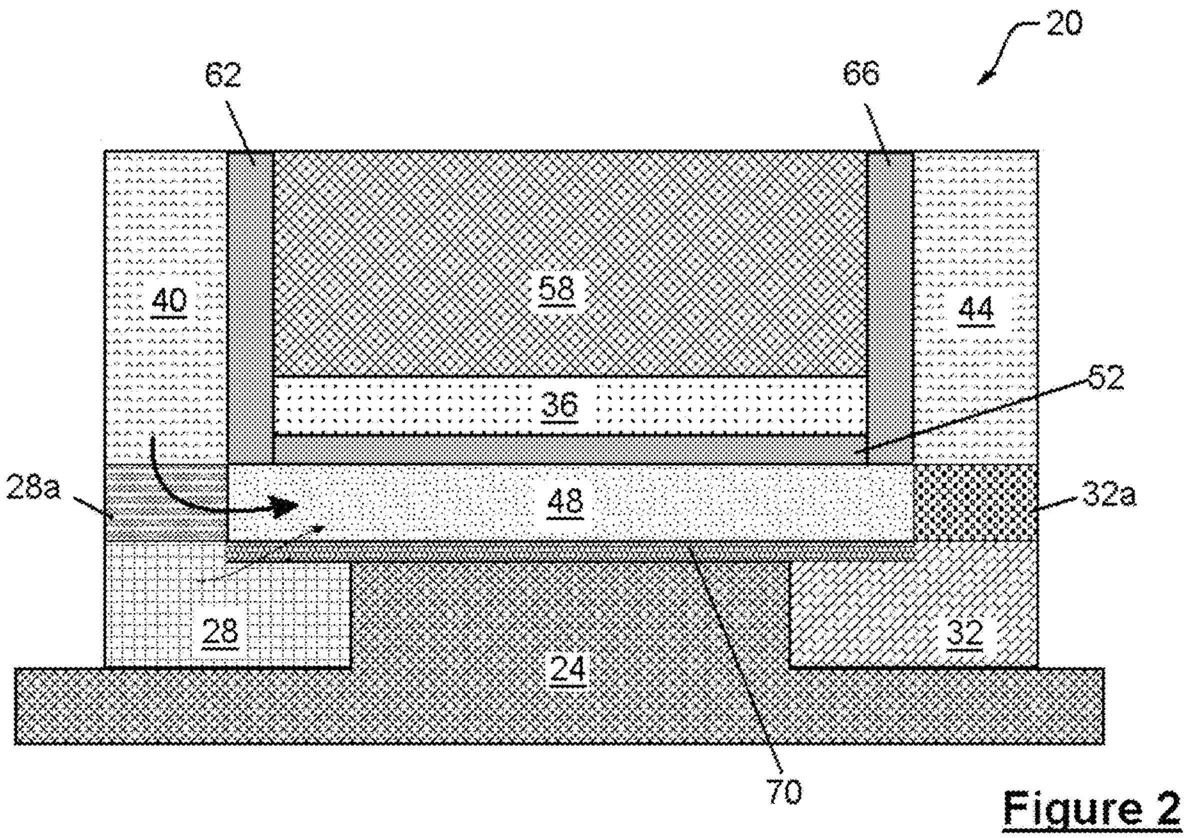
FIG. 2 shows the primary current path through the TFT of FIG. 1 when the TFT is in the ON state.

As illustrated in FIG. 2, when a sufficient voltage is applied to gate 36 to place TFT 20 into the ON state, (i.e. —a voltage equal to, or exceeding the threshold voltage is applied to gate 36), the majority of current through TFT 20 flows from source electrode 40, through carrier reservoir **28*a* and into the channel formed in semiconductor member 48, as indicated by the thick arrow in FIG. 2. A comparably small amount of current also flows from source electrode 40, through carrier reservoir 28*a* into source 28 and then into the channel formed in semiconductor member 48, as indicated by the thin arrow in FIG. 2**.

TFT 20 can be manufactured in a wide variety of manners. For example, elements can be formed via chemical vapor deposition (CVD), atomic layer deposition (ALD), sputtering, etc. as will be apparent to those of skill in the art.

Figure 3:
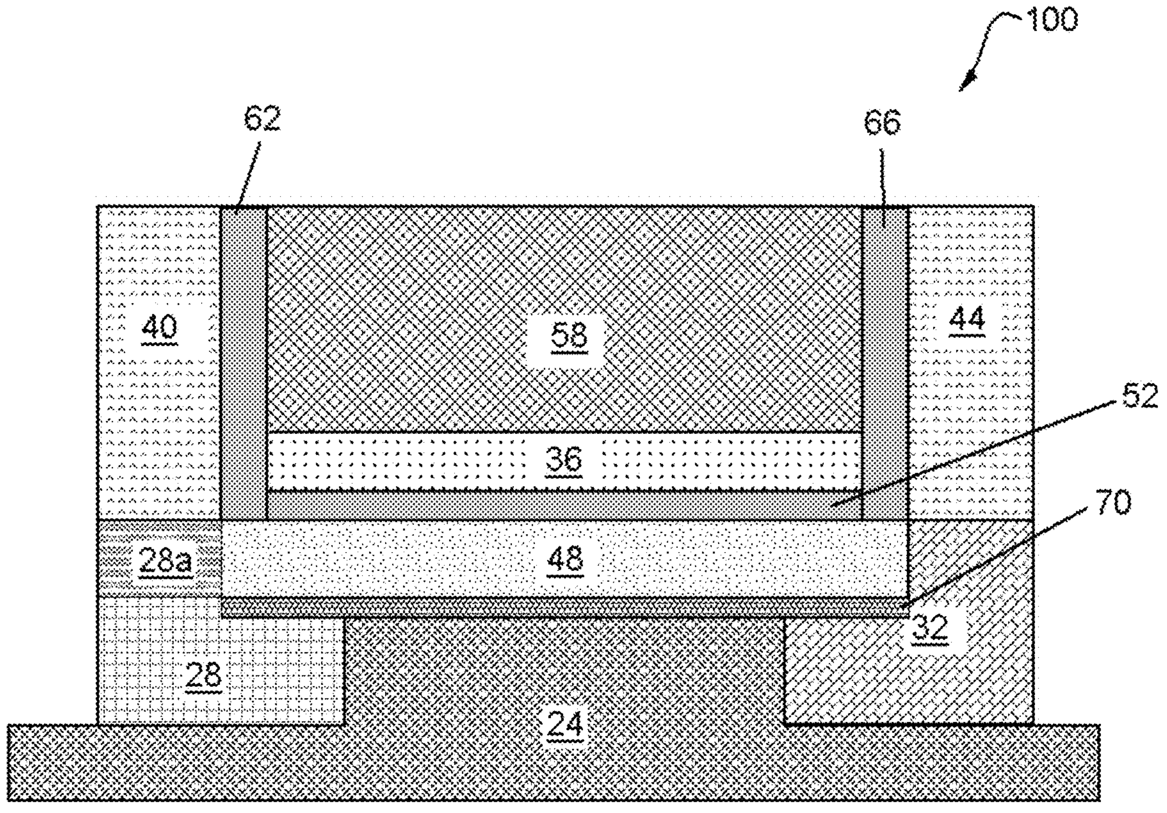
FIG. 3 shows a schematic view of a cross section through another TFT in accordance with an aspect of the present invention.

FIG. 3 shows another TFT 100 in accordance with an aspect of the present invention and wherein like elements to those discussed above with reference to FIG. 1 are indicated with like reference numerals.

Specifically, in TFT 100, drain reservoir **32*a* has been omitted. TFT 100 still offers enhanced threshold voltage levels, as described with reference to TFT 20 above, but will have a different, higher, breakdown voltage. This enables TFT 100** to be employed in a variety of applications, such as voltage regulators, that require higher voltage levels and which prior art TFTs have not been suited for.

Figure 4:
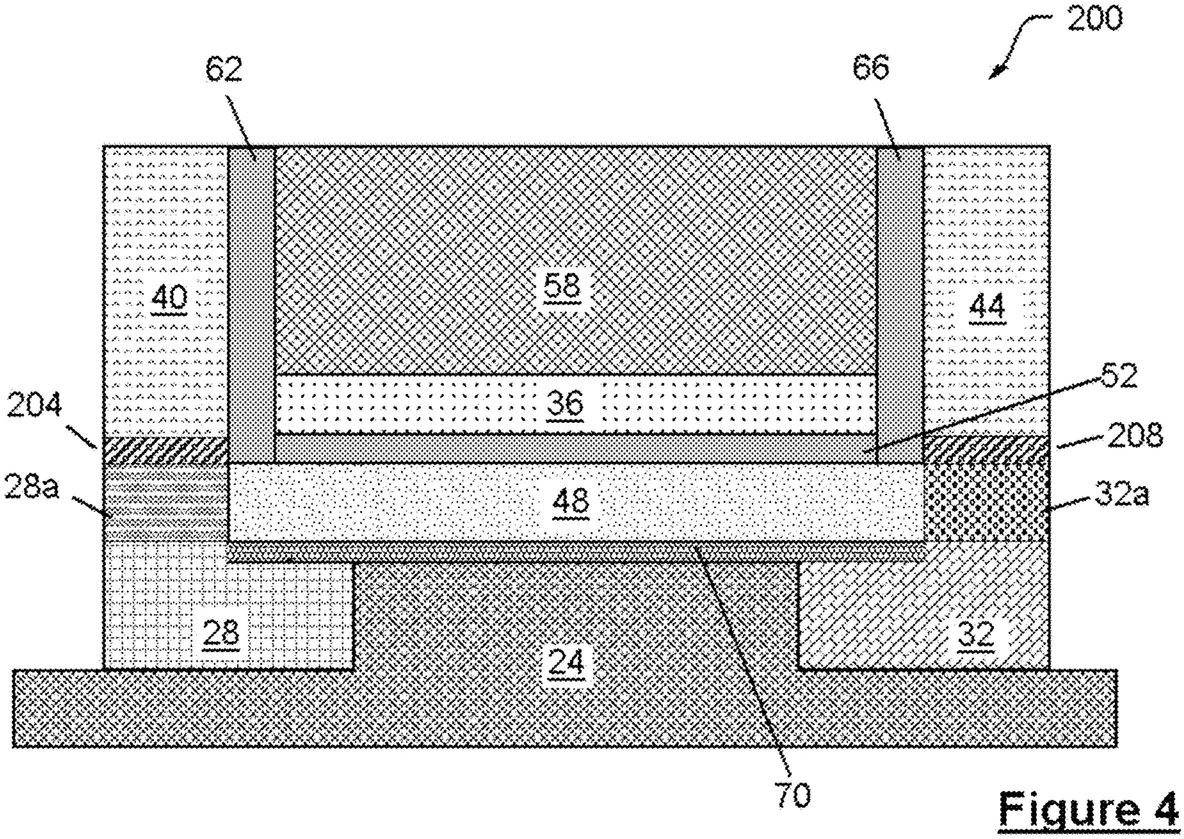
FIG. 4 shows a schematic view of a cross section through another TFT in accordance with an aspect of the present invention.

FIG. 4 shows another TFT 200 in accordance with an aspect of the present invention and wherein like elements to those discussed above with reference to FIG. 1 are indicated with like reference numerals. In this example, the performance characteristics of TFT 200 have been established by further forming reducing members 204 and 208 between source carrier reservoir **28*a* and source electrode 40 and between drain reservoir 32*a* and drain electrode 44 respectively. Reducing members 204 and 208 can be titanium, tin, hafnium, zirconium and other metals that form a conducting oxide in small forms. When annealed, reducing members 204 and 208 function to draw oxygen out of source carrier reservoir 28*a* and/or drain reservoir 32*a* (if present), and as the oxygen deficiencies accumulate, the underlying semiconductor materials of source carrier reservoir 28*a* and/or drain reservoir 32*a*** become more heavily n-type.

It is contemplated reducing members 204 and 208 can be formed as layers of as little as one to two nm of material. It is also contemplated that reducing member 208 can be omitted from TFT 200, if desired.

Figure 5:
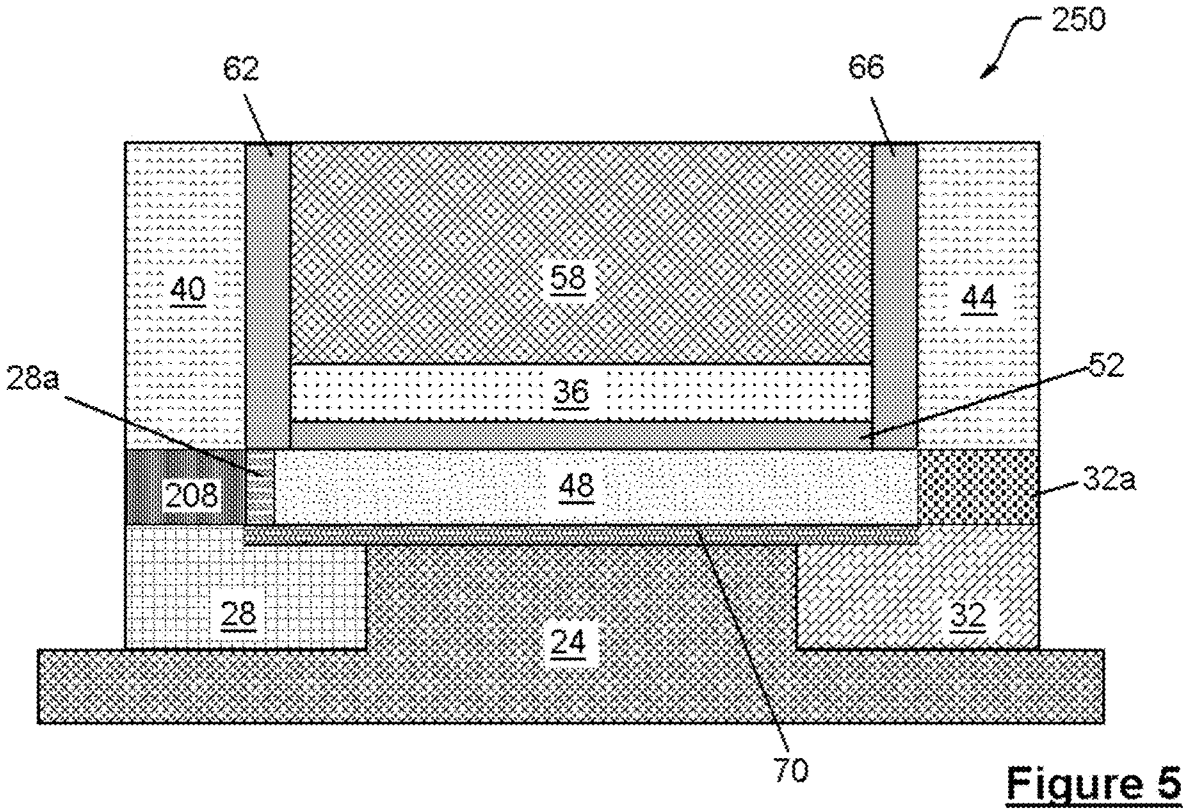
FIG. 5 shows a schematic representation of a cross section through another TFT in accordance with an aspect of the present invention.

In some cases, sufficient oxygen can be drawn from the region of semiconductor member 48 adjacent reducing members 204 and/or 208 such that this oxygen depleted region will form carrier reservoirs **28*a* and/or 32*a*. FIG. 5 shows a TFT 250 wherein reducing member 208 is, for example, titanium and has drawn oxygen from semiconductor member 48 which, for example, is tin oxide, to form carrier region 28*a*. When formed in this manner, carrier reservoir 28*a* can be formed with a stoichiometric gradient, from the oxide of semiconductor member 48 to a relatively oxygen free region adjacent reducing member 208 and thus results in a good ohmic contact to semiconductor member 48**.

While in the examples above the TFTs in accordance with aspects of the present invention are shown as laterally (i.e. —horizontally) formed devices, the present invention is not so limited and TFTs in accordance with aspects of the present invention can be also be advantageously formed as vertical (i.e. —+Z axis) devices.

Figure 6:
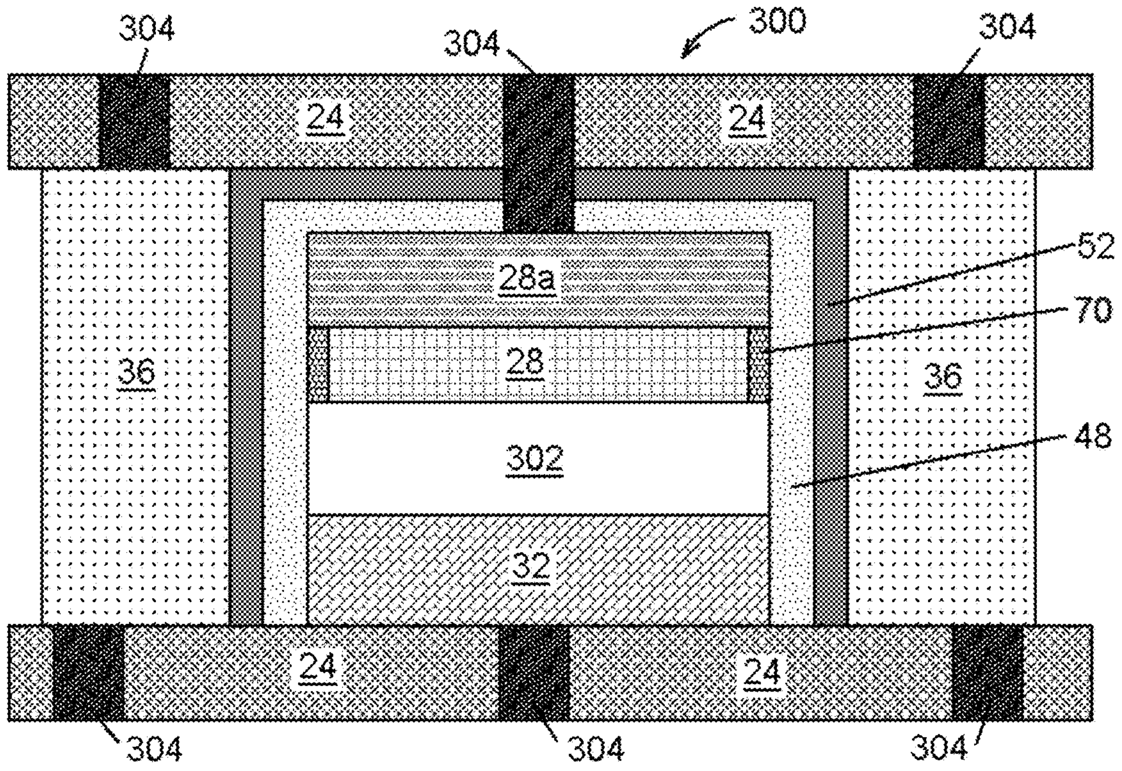
FIG. 6 shows a schematic view of a cross section through a vertically formed TFT in accordance with an aspect of the present invention.

FIG. 6 shows one example of a vertically implemented TFT 300 in accordance with another aspect of the present invention, wherein components similar to those described above are indicated with like reference numerals and including a channel dielectric spacer 302 between source 28 and drain 32.

As can be seen, TFT 300 is a vertical device and wherein the connections to TFT 300 are achieved through vias 304. In particular, and while not necessary, TFT 300 has been shown as being formed between first and second interlayer dielectric layers 24 to allow layers of TFTs 300 to be vertically stacked, one atop another, to increase device density for a given semiconductor die area.

TFT 300 is a configuration referred to by the present inventors as a "Reverse Orientation" TFT, as source carrier reservoirs 28*a* and source 28 are above semiconductor member 48 and drain 32 (drain reservoirs 32*a* has been omitted from the illustrated embodiment of TFT 300, but can be included in other implementations of TFT 300 if desired).

Figure 7:
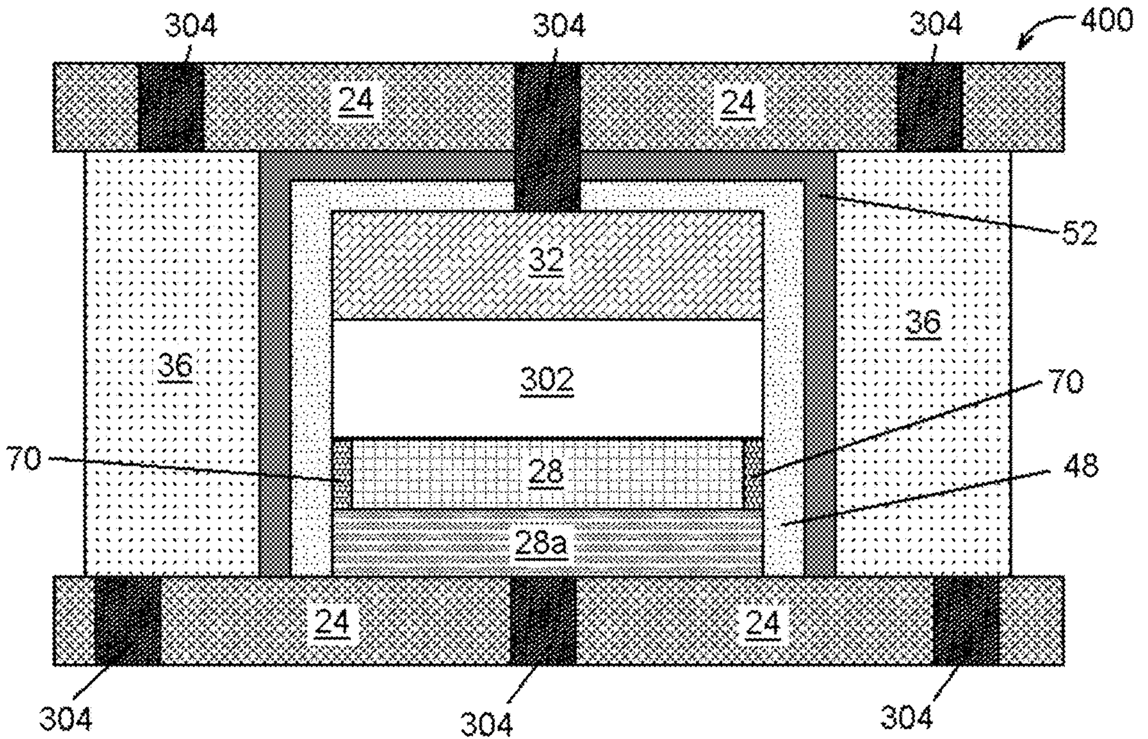
FIG. 7 shows a schematic view of a cross section through a vertically formed TFT in accordance with another aspect of the present invention.

FIG. 7 shows another example of a vertical TFT 400 in accordance with another aspect of the present invention, wherein like components to those shown and discussed in reference to FIG. 6 are indicated with like reference numerals. TFT 400 is referred to by the present inventors as a "Forward Orientation" TFT as drain 32 is above semiconductor member 48, source 28 and source carrier reservoir 28*a*. Drain reservoir 32*a* has also been omitted from this example, but can be included in other implementations of TFT 400 if desired.

While TFTs 20, 100, 200 and 250, as described above, can also be formed in stacked configurations, with TFTs being formed on planes over other planes of TFTs, it is contemplated that vertical implementations of TFTs in accordance with the present invention, such as TFTs 300 and 400, can often be preferred due to their ease of connection to other circuit elements and their reduced die area requirements compared to laterally formed TFTs.

Another particular advantage of the present invention is that the materials and manufacturing processes employed with the above described TFTs are selected, as are the methods of forming the TFTs, such that TFTs in accordance with the present invention can be formed at relatively low temperatures as Middle of Line (MOL) and/or Back End of Line (BEOL) processes.

For example, annealing of TFTs in accordance with aspects of the present invention can be performed at temperatures below about 400 degrees Centigrade. Thus, in the illustrated examples, insulating layer 24 can be, for example, a layer of silicon dioxide formed on top of CMOS circuitry otherwise fabricated by conventional Front End of Line (FEOL) fabrication processes and one or more planes of TFTs in accordance with the present invention can be formed over the plane of the CMOS circuitry.

By enabling the formation of circuits of TFTs, in accordance with aspects of the present invention, as MOL and/or BEOL processes, on top of FEOL fabricated CMOS circuitry, true three dimensional semiconductor dies, circuits and devices can be fabricated.

It is contemplated that MOL and BEOL-formed circuits comprising TFTs in accordance with aspects of the present invention will be useful for a variety of applications, including SRAM memory cells, implementing "dark silicon" power saving strategies and/or to provide a variety of non-core functionalities, such as voltage regulators, etc., thus increasing overall densities of semiconductor dies to previously unobtainable levels.

The above-described embodiments of the invention are intended to be examples of the present invention and alterations and modifications may be effected thereto, by those of skill in the art, without departing from the scope of the invention which is defined solely by the claims appended hereto.

We claim:

1. A thin film transistor, comprising:
- an insulator;
- a source formed on the insulator;
- a drain formed on the insulator;
- an n-type semiconductor member;
- a source-channel interfacial member formed on the insulator and extending between at least the n-type semiconductor member and the source, the source-channel interfacial member acting as a voltage controlled electron transport barrier;
- a gate dielectric formed over the n-type semiconductor member;
- a gate formed on the gate dielectric;
- an n-type semiconductor carrier reservoir formed at the source; and
- wherein a channel is formed in the n-type semiconductor member when a threshold voltage is applied to the gate electrode, the channel conducting charge carriers through the n-type semiconductor member from the source to the drain and wherein the carrier reservoir provides a reservoir of negative charge carriers to mitigate carrier starvation through the channel of the n-type semiconductor member.

2. The thin film transistor of claim 1 wherein the n-type semiconductor carrier reservoir has an effective electron mass of available electronic states similar to that of the n-type semiconductor member.

3. The thin film transistor of claim 2 further including an n-type semiconductor drain reservoir at the drain, the n-type drain reservoir providing improved conduction of charge carriers out of the channel of the n-type semiconductor member.

4. The thin film transistor of claim 3 wherein the n-type semiconductor drain reservoir has an effective electron mass of available electronic states similar to that of the n-type semiconductor member.

5. The thin film transistor of claim 1 further including a reducing member formed adjacent the n-type semiconductor member and the source to form the n-type semiconductor carrier reservoir at the source.

6. The thin film transistor of claim 3 further including a reducing member formed adjacent the n-type semiconductor member and the source to form the carrier reservoir at the source and a reducing member formed adjacent the n-type semiconductor member and the drain to form the n-type drain reservoir.

7. The thin film transistor of claim 5 wherein the reducing member is a metal selected from the group comprising: titanium; molybdenum; tin; hafnium; or zirconium.

8. The thin film transistor of claim 1 wherein the transistor is a lateral transistor.

9. The thin film transistor of claim 1 wherein the transistor is a vertical transistor.

10. The thin film transistor of claim 1 formed in middle of line fabrication processes.

11. The thin film transistor of claim 1 formed in back end of line fabrication processes.

12. A thin film transistor, comprising:

a source;

a drain;

a gate;

an n-type semiconductor member in which a channel can be formed;

a source-channel interfacial member being a p-type material and connecting the source to the semiconductor member and being operable to establish a threshold voltage which, when applied to the gate, enables a conductive channel to form through the n-type semiconductor member from the source to the drain; and a source carrier reservoir contacting the source and the n-type semiconductor member, the source carrier reservoir being an n-type semiconductor providing a supply of charge carriers to the n-type semiconductor member when the threshold voltage is applied.

13. The thin film transistor of claim 12 wherein the source carrier reservoir has an effective electron mass of available electronic states similar to that of the n-type semiconductor member.

14. The thin film transistor of claim 12 further comprising an n-type semiconductor drain reservoir contacting the drain and the n-type semiconductor member, the drain reservoir at the drain, the drain reservoir providing improved conduction of charge carriers out of the channel of the n-type semiconductor member.

15. The thin film transistor of claim 12 wherein the transistor is formed as a lateral transistor.

16. The thin film transistor of claim 12 wherein the transistor is formed as a vertical transistor.

17. A thin film transistor, comprising:

an insulator;

a source formed on the insulator;

a drain formed on the insulator;

an n-type semiconductor member;

a p-type source-channel interfacial member formed on the insulator and extending between at least the n-type semiconductor member and the source;

a gate dielectric formed over the n-type semiconductor member;

a gate formed on the gate dielectric;

an n-type semiconductor carrier reservoir formed on the source;

a source electrode formed on the carrier reservoir;

a gate electrode formed on the gate;

and a drain electrode formed on the drain; and wherein a channel is formed in the n-type semiconductor member when a threshold voltage is applied to the gate electrode, the channel conducting charge carriers through the n-type semiconductor member and wherein the carrier reservoir provides a reservoir of negative charge carriers to mitigate carrier starvation through the channel of the n-type semiconductor member and wherein the source-channel interfacial member forms a depletion region in the n-type semiconductor member when the threshold voltage is not applied to the gate to substantially inhibit current flow through the n-type semiconductor member.

18. The thin film transistor of claim 17 wherein the transistor is formed in a middle of the line manufacturing process.

19. The thin film transistor of claim 17 wherein the transistor is formed in a back end of the line manufacturing process.

20. The thin film transistor of claim 17 wherein the transistor is a vertical transistor.

* * * * *